Aug. 4, 1970 J. E. KAUFFMAN 3,522,490

SEMICONDUCTOR PACKAGE WITH HEAT CONDUCTING MOUNTING EXTENDING FROM PACKAGE ON SIDE OPPOSITE CONDUCTOR EXTENSIONS

Original Filed June 28, 1965 2 Sheets-Sheet 1

INVENTOR
John E. Kauffman

BY John D. Graham

ATTORNEY

INVENTOR
John E. Kauffman

BY John D. Graham

ATTORNEY

United States Patent Office 3,522,490

Patented Aug. 4, 1970

3,522,490

SEMICONDUCTOR PACKAGE WITH HEAT CONDUCTING MOUNTING EXTENDING FROM PACKAGE ON SIDE OPPOSITE CONDUCTOR EXTENSIONS

John E. Kauffman, Richardson, Tex., assignor to Texas Instruments Incorporated, Dallas, Tex., a corporation of Delaware Continuation of application Ser. No. 467,533, June 28, 1965. This application Jan. 30, 1967, Ser. No. 612,737
Int. Cl. H05k *5/00*
U.S. Cl. 317—234 11 Claims

ABSTRACT OF THE DISCLOSURE

Disclosed is a semiconductor package utilizing a unitary frame having a semiconductor mounting area with a heat conducting mounting tab member extending from the mounting area and a member extending in the opposite direction from the tab member with a cross terminal member having a number of finger members extending toward the semiconductor mounting area. After a semiconductor is mounted on a mounting area, the mounted semiconductor is encapsulated and the terminal cross member is removed to complete the finished device.

This is a continuation application of our pending application, Ser. No. 467,533, filed June 28, 1965. This invention relates to semiconductors. More particularly, it relates to semiconductors encapsulated in a nonconductive medium and having a flexible tab and flexible leads.

Semiconductor devices have been conventionally fabricated on solid metal headers, such as copper or steel, and have been adapted for mounting to a chassis by such means as a stud package or the conventional header which has two mounting holes such as is exemplified by the well-known TO–3 header. Such devices have been characterized by an inherent lack of flexibility and by an inefficient use of the available volume of space into which components may be placed. The stud package, in particular, but also the two-mounting hole header, described above, are also sensitive to torque pressures applied in mounting the device to the chassis and thus are torque-limited.

It is therefore an object of the present invention to provide a semiconductor package which has mechanical flexibility. It is another object to provide a method of fabricating a mechanically flexible semiconductor package.

It is still another object of the invention to provide a semiconductor package which facilitates the efficient use of available circuit fabrication space. It is also an object of the invention to provide a method of making a semiconductor package which so facilitates the efficient use of such space.

It is still another object of the invention to provide a semiconductor package and a method for making same which is not torque sensitive and thus will not destroy the semiconductor device while applying mounting pressure.

These and other objects and features of the invention will be readily understood from the following detailed description when read in conjunction with the appended claims and attached drawings, in which:

FIG. 1 is a pictorial view of a transistor fabricated according to the invention;

FIGS. 2*a*–2*d* illustrate four examples of utilization of a semiconductor fabricated according to the invention;

The invention, in brief, comprises a versatile semiconductor package whereby a transistor, for example, is mounted on a unitary metallic frame structure, one end which is relatively wider than the other elements of the unitary structure, serves as a flexible collector tab useful both as a mounting means and as a heat sink for the collector, and the other end is comprised of an E-shaped group of fingers, the tab member being wider than the fingers. The metallic base and emitter leads are respectively secured to the fingers, as by ball-bonding, welding or the like, and the transistor is then encapsulated in some insulating medium such as epoxy or plastic. After the plastic body is firmed, the E-shaped fingers are severed from each other to provide the leads for the semiconductor device. The leads and the collector tab would normally have holes punched therein to facilitate the mounting and provide for external wiring connections. As will be explained in greater detail below, both the tab and the leads may be formed in several configurations to provide an almost unlimited mechanical flexibility.

Figures 1, 2:
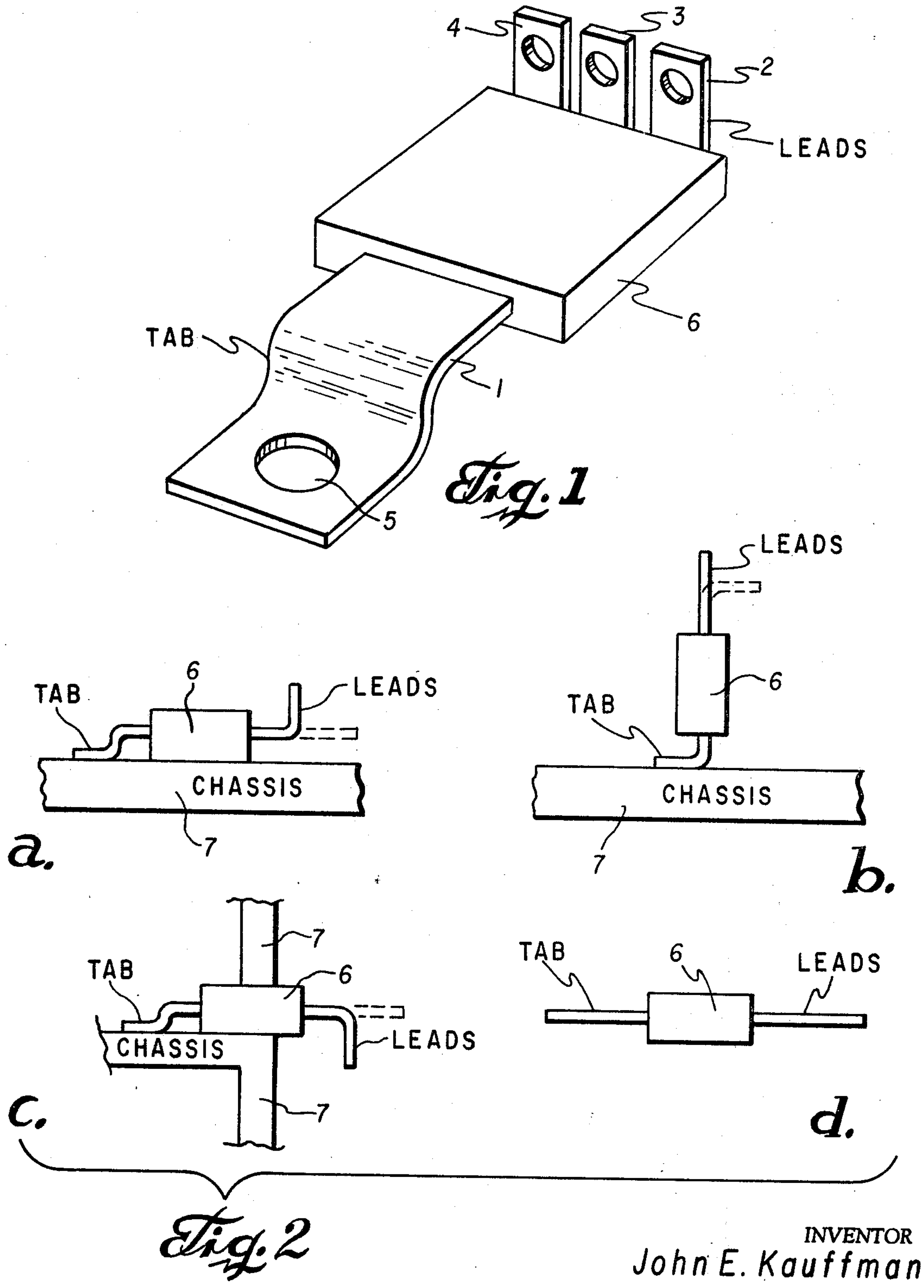

For a more detailed description, with specific reference to FIG. 1, there is illustrated a transistor fabricated according to the invention, having an epoxy encapsulation 6, a collector lead 2, a base lead 3, an emitter lead 4, and a collector tab 1, having therein a mounting hole 5. It should be appreciated that the tab 1 could be severed from the body 6 if power dissipation is maintained at a low level, in which case the device may be mounted by the lead 2, 3 or 4. If desired, the tab 1 can be used as the collector lead and the lead 2 either severed to conserve space or left with no external wiring connection. In any event, the tab 1 and the leads 2, 3 and 4 can be formed into a number of different configurations to facilitate the external mounting and wiring, as more readily understood by referring to FIGS. 2*a*–2*d*.

In FIG. 2*a*, the body 6 is maintained relatively flush, with the tab secured to the chassis 7, as illustrated. The leads can be formed in a variety of ways, with the solid and dotted lines showing two examples. Another way of mounting the device is illustrated in FIG. 2*b*, wherein the body 6 is mounted substantially perpendicular to the chassis 7, and once again the leads may be formed as desired. FIG. 2*c* illustrates how the body 6 may be "fed through" the chassis 7, while FIG. 2*d* illustrates how the package would appear when neither the tab nor the leads are bent away from the normal. It should be appreciated that these are merely illustrative of examples for mounting a semiconductor device fabricated according to the invention, and are in no sense to be construed as a limitation upon the invention.

Figure 3:
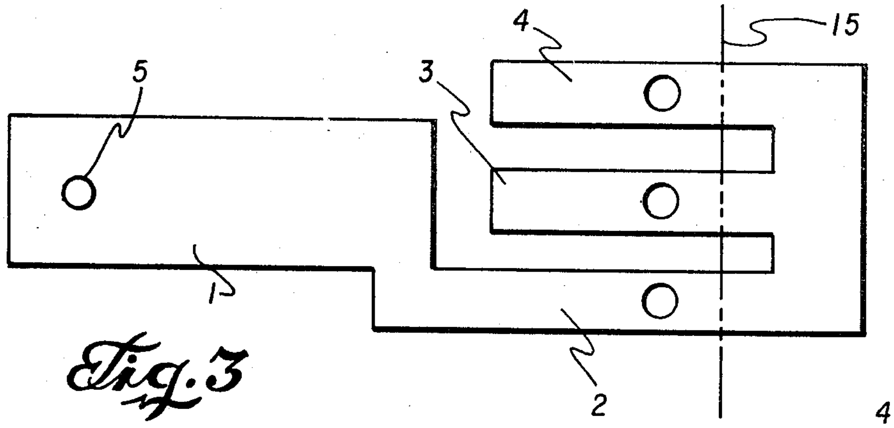
FIG. 3 illustrates a plan view of a typical mounting tab and mounting surface used in the fabrication of a semiconductor package according to the invention.

FIG. 3 illustrates the unitary structure, which consists of the mounting tab 1 and the collector, base and emitter leads 2, 3 and 4, respectively. This unitary structure may be either metallic or metallic coated, such as with copper, gold, silver, aluminum or some other good electrical and thermal conductor. The dotted line 15 represents the location of the severance which will be subsequent to the mounting of the transistor (not illustrated) and the insulating encapsulation (also not illustrated).

Figure 4:
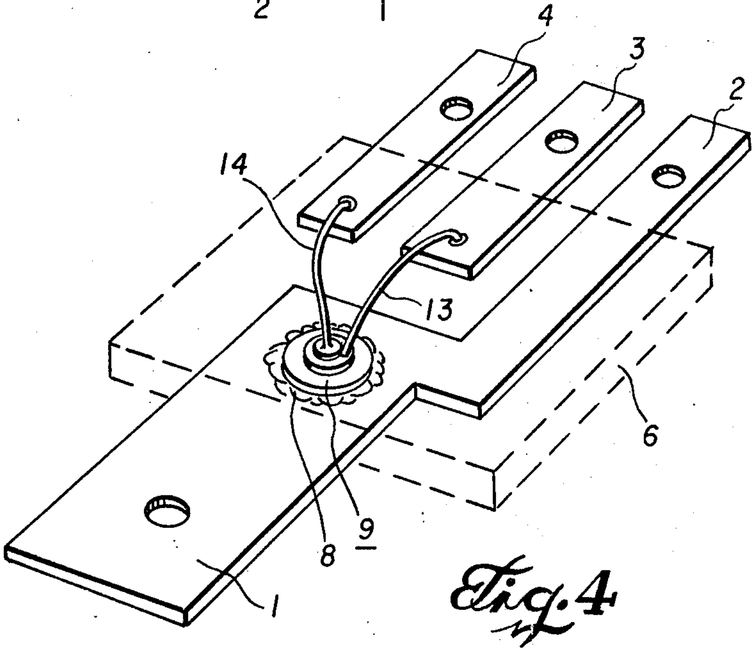
FIG. 4 illustrates a pictorial view of a transistor mounted on the surface of FIG. 3.

In FIG. 4 there is illustrated a transistor 9 mounted on the collector tab 1 as by soldering, the tab 1 providing the sole support for transistor 9. It will be observed that the transistor mounted on tab 1 is much smaller than the mounting area on tab 1. The well-known techniques of using a molybdenum substrate and so-called "hard" (high temperature) solders can also be used, as the soldering operation forms no part of the invention. The emitter lead 14 is secured both to the emitter and to the emitter lead 4, while the base lead 13 is secured both to the base region and to the base lead 3. The collector of the transistor is normally mounted directly to the tab. If desired, the transistor could have a planarized collector surface with another external lead secured to the collector lead 2.

After the transistor has been mounted as above described, the lead wires secured as above, the encapsulation is formed over said transistor, illustrated by the dotted line as an epoxy body 6. Subsequently, the leads are severed at the dotted line 15 as illustrated in FIG. 3. Of course, the severance could be done prior to encapsulation but would not be practical.

Figure 5:
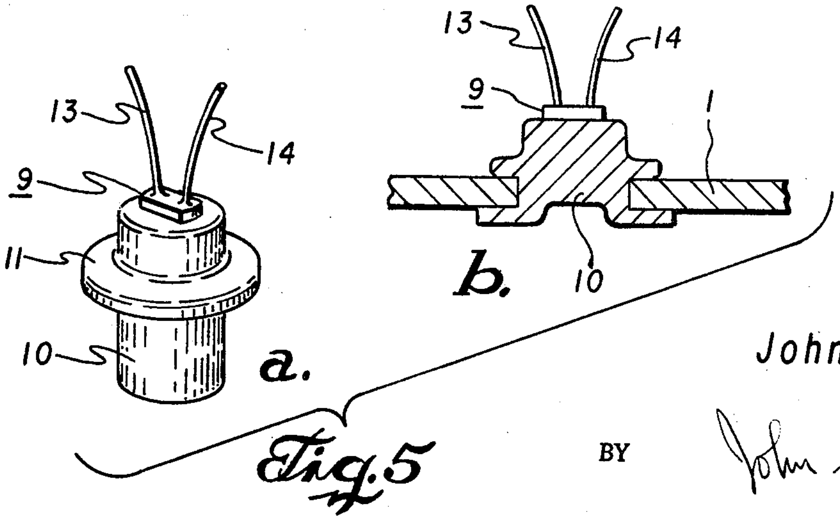
FIGS. 5*a* and 5*b* illustrate an alternative method of mounting a semiconductor wafer to the mounting surface as shown in FIG. 3.

FIG. 5 illustrates an alternative method of mounting the transistor on the tab 1 in lieu of the soldering operation. This type of mounting would probably be used most frequently whenever the process includes a heavy etching step or some other such stringent processing. Heavy etching normally carries with it an expensive plating process of the mounting surface so as to not harm the surface. In lieu of plating the whole tab, a copper slug 10, which has been adequately plated such as with nickel and gold, and which has the appearance of a rivet, and which is effectively used as rivet, is used as the mounting surface for the semiconductor wafer 9. After the transistor is mounted on the slug and the device is electrically tested, the slug is inserted in a hole (not illustrated) in the collector tab 1 and swaged to the tab as illustrated in FIG. 5*b*. The lip 11 of the slug helps in the swaging process.

While the device shown has been with reference to a transistor, it should be appreciated that any semiconductor device, such as a diode, capacitor, resistor, field effect device, integrated circuit, thin film circuit, hybrid circuit and the like could be so fabricated, the transistor fabrication being merely illustrative of a semiconductor device which can be packaged according to the invention. For example, if it should be desired to package an integrated circuit, the unitary structure of FIG. 3 need only be expanded to have the requisite number of fingers.

Likewise, while the intermediate structure has been illustrated with reference to a single unitary member configuration, it should be appreciated that the member is merely illustrative of one embodiment and the invention is to be limited only by the appended claims.

What is claimed is:

1. A semiconductor device comprising a substantially flat metallic member having an intermediate mounting area, a semiconductor wafer mounted on said mounting area, one end of said member being a heat conducting mounting tab, the other end of said member being an electrical connector to said wafer, an insulating mass surrounding said wafer and said mounting area, at least a portion of said electrical connector and said mounting tab being exterior of said insulating mass, a conductive lead having one end within said insulating mass and terminating near said mounting area, the other end of said lead being exterior of said insulating mass, an electrical connection within said insulating mass between said one end of said lead and a region of said semiconductor wafer, said mounting tab being wider than said lead and spanning at least the width of said lead.

2. A semiconductor device comprising a substantially flat metallic member having an intermediate mounting area, a semiconductor wafer mounted on said mounting area, one end of said member being a heat conducting mounting tab, the other end of said member being an electrical connector to said wafer, an insulating mass surrounding said wafer and said mounting area, at least a portion of said electrical connector and said mounting tab being exterior of said insulating mass, a conductive lead having one end within said insulating mass and terminating near said mounting area, the other end of said lead being exterior of said insulating mass, an electrical connection within said insulating mass between said one end of said lead and a region of said wafer, said mounting tab being wider than said lead and having a hole therein for mounting said device.

3. A semiconductor device comprising a substantially flat metallic member having an intermediate mounting area, a semiconductor wafer mounted on said mounting area, one end of said member being a heat conducting mounting tab, the other end of said member being an electrical connector to said wafer, an insulating mass surrounding said wafer and said mounting area, said electrical connector and said mounting tab being exterior of said insulating mass, a conductive lead having one end within said insulating mass and terminating near said mounting area, the other end of said lead being exterior of said insulating mass, an electrical connection within said insulating mass between said one end of said lead and a region of said wafer, said insulating mass having a flat portion substantially parallel to the plane of said wafer, and said mounting tab having mounting means thereon in substantially the same plane as said flat portion.

4. A semiconductor device comprising a substantially flat metallic member having an intermediate mounting area, a semiconductor wafer having a plurality of semiconductor regions mounted on said mounting area, one end of said member being a heat conducting mounting tab, the other end of said member being an electrical connector to said wafer, an insulating mass surrounding said wafer and said mounting area, said electrical connector and said mounting tab being exterior of said insulating mass, a plurality of conductive leads each having one end within said insulating mass and terminating near said mounting area and another end exterior of said insulating mass, electrical connections within said insulating mass between said semiconductor regions and said one end of said leads, said mounting tab being wider that at least one of said leads and extending beyond the width of said at least one of said leads.

5. An intermediate semiconductor device structure comprising a substantially flat unitary frame having a mounting area, a heat conducting mounting tab member integral with said mounting area, an outwardly extending member integral with said mounting area, a cross member connected to said extending member and a lead member having an end connected to said cross member and another end free and located near said mounting area, a semiconductor wafer mounted on said mounting area, said wafer being smaller than said mounting area, said mounting tab member being wider than said lead member and extending beyond the width of said lead member, an electrical connection between a region on said semiconductor wafer and said free end of said lead member, and insulating mass surrounding said semiconductor wafer, said mounting area, said electrical connection and said free end of said lead member, a portion of said mounting tab member, said extending member and said lead member being exterior of said insulating mass, whereby said cross member may be severed thereby electrically isolating said lead member and said extending member.

6. The intermediate semiconductor device structure according to claim 5, including another lead member having an end connected to said cross member and another end free and located near said mounting area, said semiconductor wafer comprising a transistor having collector, base and emitter regions diffused therein, said region on said semiconductor wafer being said base and another electrical connection between said emitter and said free end of said another lead.

7. The intermediate semiconductor device structure according to claim 5, wherein said semiconductor wafer is soldered to said mounting area.

8. The intermediate semiconductor device structure according to claim 5, wherein said semiconductor wafer is mounted on a metal slug swaged to said mounting area.

9. The intermediate semiconductor device structure according to claim 5, including a hole in said mounting tab.

10. A semiconductor device according to claim 1, including a hole in said mounting tab for mounting the device.

11. A semiconductor device according to claim 4 wherein said leads and said electrical connector are substantially parallel to one another.

References Cited

UNITED STATES PATENTS

| | | | |
|---|---|---|---|
| 3,281,628 | 10/1966 | Bauer et al. | 317—234 |
| 3,072,832 | 1/1963 | Kilby | 317—235 |
| 3,195,026 | 7/1965 | Wegner et al. | 317—234 |
| 3,235,937 | 2/1966 | Lanzl et al. | 317—234 |
| 3,264,712 | 8/1966 | Hayashi et al. | 317—235 |
| 3,271,634 | 9/1966 | Heaton | 317—234 |
| 3,274,456 | 9/1966 | Pittler et al. | 317—234 |
| 3,243,670 | 3/1966 | Dunster et al. | 317—234.3 |
| 3,265,806 | 8/1966 | Burks et al. | |
| 3,309,579 | 3/1967 | St. Louis et al. | 317—234.4 |

FOREIGN PATENTS

| | | |
|---|---|---|
| 966,019 | 8/1964 | Great Britain. |

JOHN W. HUCKERT, Primary Examiner

B. ESTRIN, Assistant Examiner

U.S. Cl. X.R.

317—234, 235; 29—589